US007507670B2

(12) United States Patent
Shih et al.

(10) Patent No.: US 7,507,670 B2
(45) Date of Patent: Mar. 24, 2009

(54) SILICON ELECTRODE ASSEMBLY SURFACE DECONTAMINATION BY ACIDIC SOLUTION

(75) Inventors: Hong Shih, Walnut, CA (US); Tuochuan Huang, Saratoga, CA (US); Chunhong Zhou, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 93 days.

(21) Appl. No.: 11/019,726

(22) Filed: Dec. 23, 2004

(65) Prior Publication Data

US 2006/0141802 A1 Jun. 29, 2006

(51) Int. Cl.
*H01L 21/302* (2006.01)

(52) U.S. Cl. ....................... 438/704; 257/347; 438/459; 137/3

(58) Field of Classification Search ................ 257/347; 438/459, 704; 137/3
See application file for complete search history.

(56) References Cited

U.S. PATENT DOCUMENTS 5,532,182 A * 7/1996 Woo ........................... 438/254
5,618,384 A * 4/1997 Chan et al. .................. 438/597
5,637,523 A * 6/1997 Fazan et al. ................. 438/397
5,989,981 A * 11/1999 Nakashima et al. ......... 438/459
6,376,385 B2 4/2002 Lilleland et al.
6,399,499 B1 6/2002 Lee
6,810,887 B2 11/2004 Tan
2002/0107158 A1 8/2002 Peters et al.
2002/0127853 A1* 9/2002 Hubacek et al. ............. 438/689
2003/0104703 A1* 6/2003 Yang et al. .................. 438/706
2003/0150476 A1 8/2003 Suzuki
2003/0221702 A1 12/2003 Peebles
2004/0003828 A1 1/2004 Jackson
2004/0149699 A1* 8/2004 Hofman et al. ........ 219/121.43
2005/0056218 A1* 3/2005 Sun et al. .................... 118/715
2005/0178748 A1* 8/2005 Buchberger et al. .... 219/121.48

OTHER PUBLICATIONS

H. Robbins and B. Schwartz, "Chemical Etching of Silicon: I. The System HF, $HNO_3$, and $H_2O$," Journal of Electrochemical Society, vol. 106, No. 6, (Jun. 1959) 505-508.
B. Schwartz and H. Robbins, "Chemical Etching of Silicon: III. A Temperature Study in the Acid System," Journal of the Electrochemical Society, vol. 108, No. 4, (Apr. 1961) 365-372.
H.J. Lewerenz and M. Aggour, "On the origin of photocurrent oscillation at Si electrodes," J. Electroanal. Chem., 351 (1993) 159-168.
Xiaoge Gregory Zhang, *Electrochemistry of silicon and its oxide*, Kluwer Academic/Plenum Publishers, New York, 2001.
International Search Report and Written Opinion dated Nov. 17, 2006 for PCT/US05/45273.

* cited by examiner

*Primary Examiner*—Matthew Smith
*Assistant Examiner*—Colleen E Rodgers
(74) *Attorney, Agent, or Firm*—Buchanan Ingersoll & Rooney PC

(57) ABSTRACT

Methods for cleaning silicon surfaces of electrode assemblies by efficiently removing contaminants from the silicon surfaces without discoloring the silicon surfaces using an acidic solution comprising hydrofluoric acid, nitric acid, acetic acid, and balance deionized water.

21 Claims, 7 Drawing Sheets

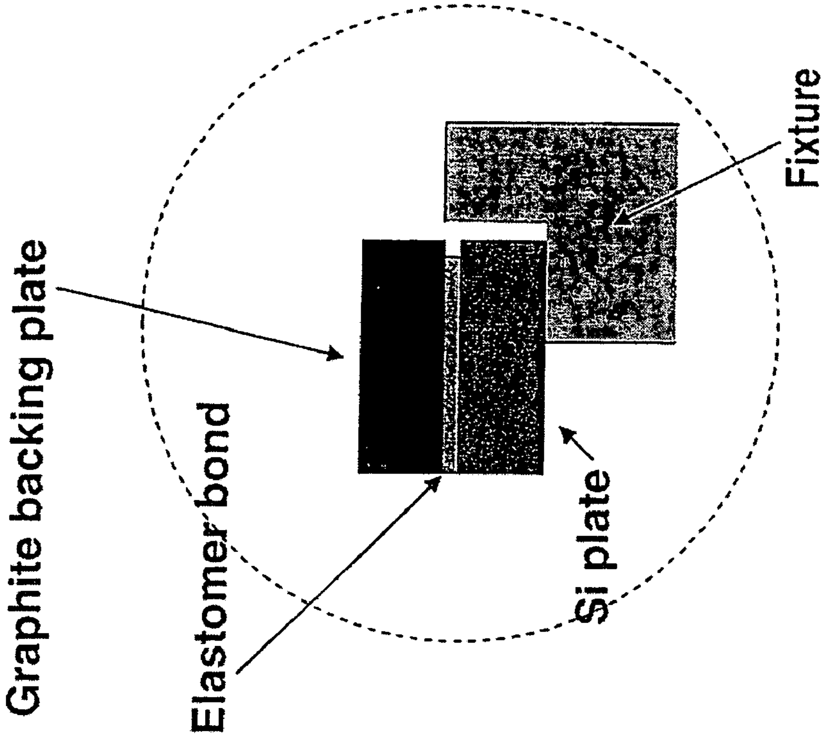
FIG. 1B
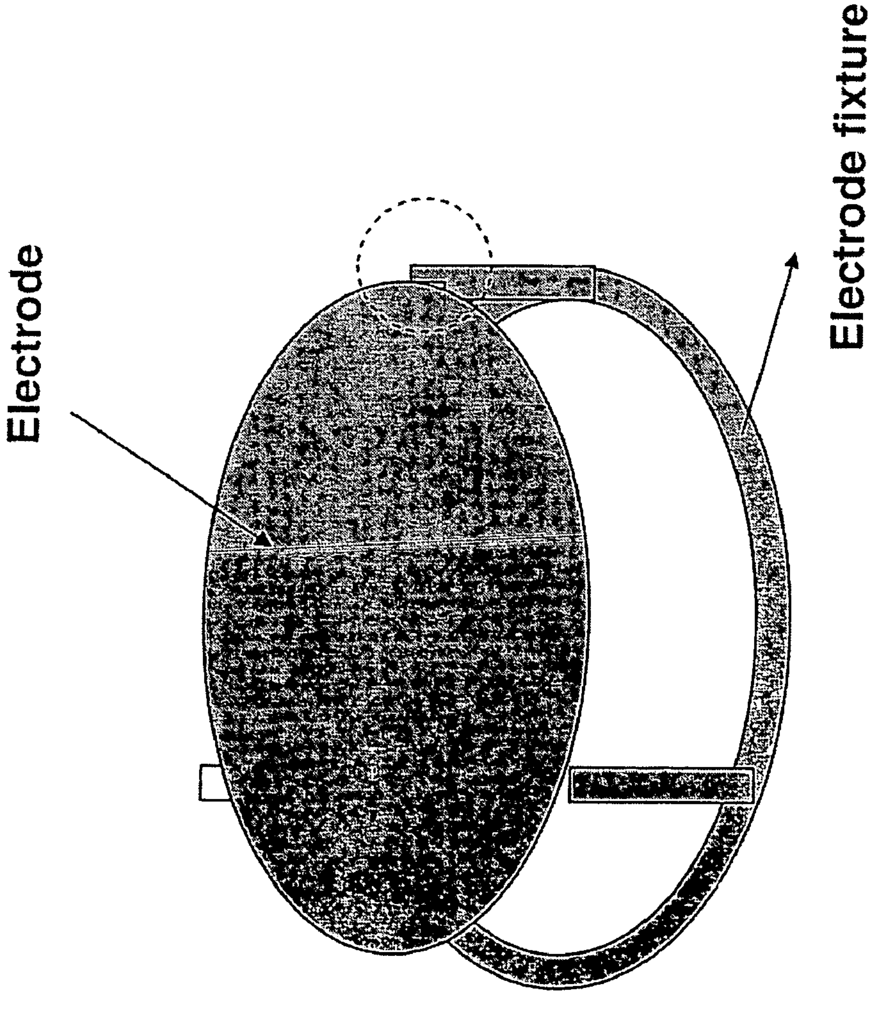
FIG. 1A
FIG. 1

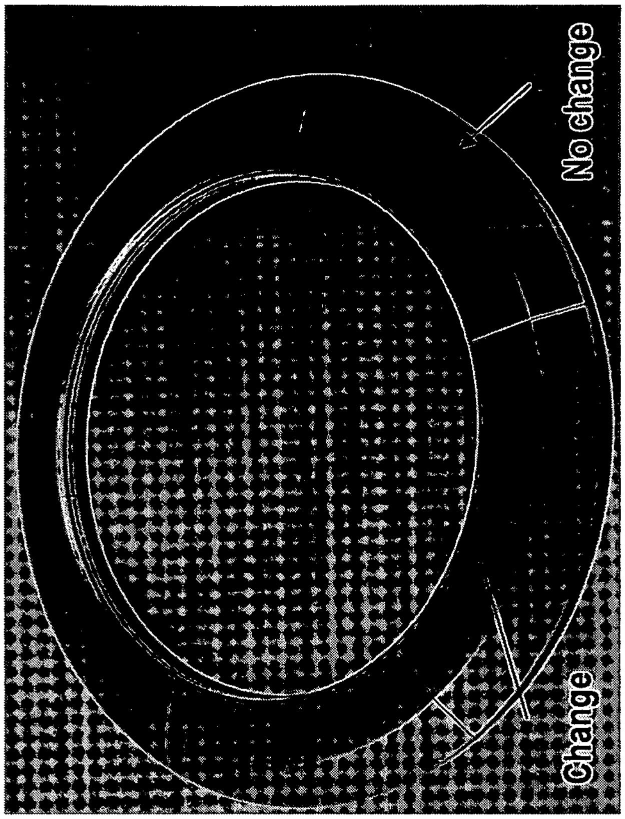
FIG. 6B
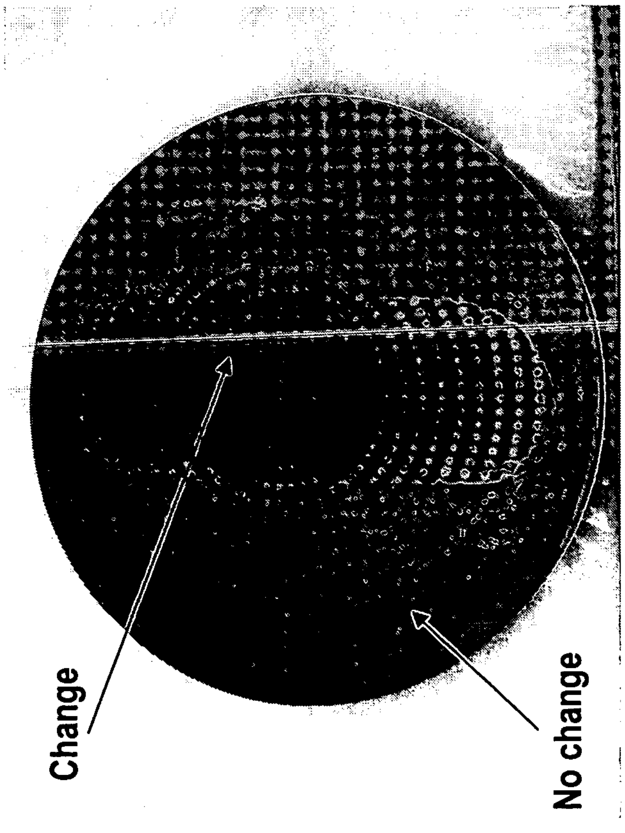
FIG. 6A
FIG. 6

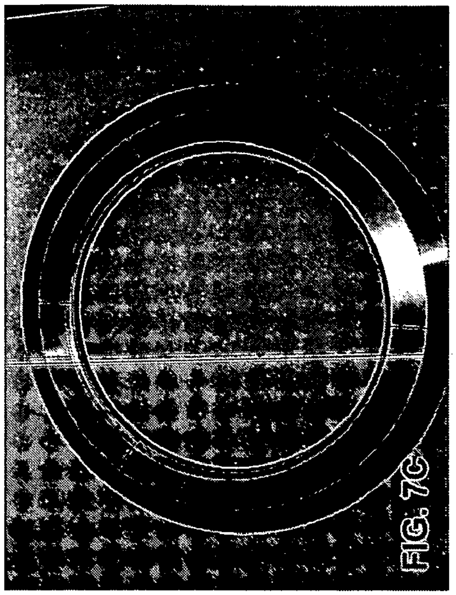
FIG. 7C
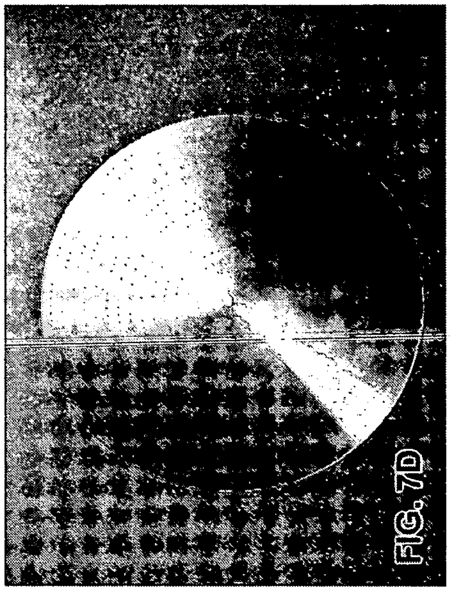
FIG. 7D
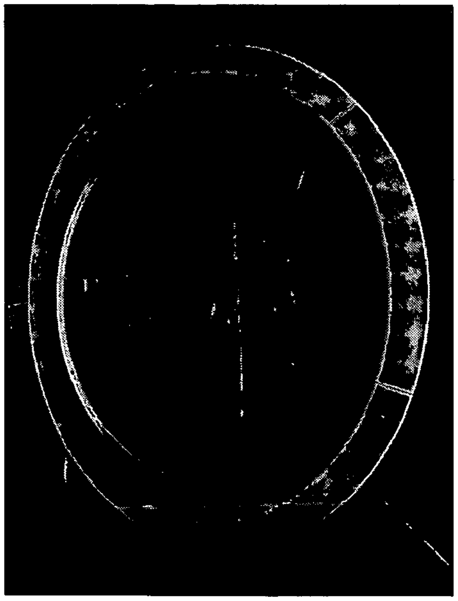
FIG. 7A
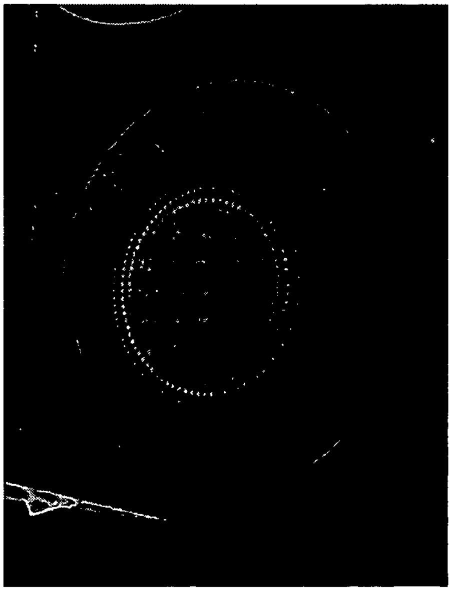
FIG. 7B
FIG. 7

SILICON ELECTRODE ASSEMBLY SURFACE DECONTAMINATION BY ACIDIC SOLUTION

SUMMARY

A method of cleaning a used electrode assembly having a plasma-exposed silicon surface comprises contacting the silicon surface with an acidic solution. The acidic solution comprises hydrofluoric acid, nitric acid, acetic acid, and balance deionized water. Preferably, contaminants are removed from the silicon surface, without discoloration of the cleaned surface. The electrode assembly can be used for etching a dielectric material in a plasma etching chamber after the cleaning.

BRIEF DESCRIPTION OF THE DRAWING FIGURE

FIG. 1A shows a fixture for supporting an electrode assembly during cleaning and FIG. 1B shows an enlarged area of FIG. 1A.

FIG. 6A shows discoloration of the silicon surface of an inner electrode assembly that can result from wiping with an acidic solution and FIG. 6B shows discoloration of the silicon surface of an outer electrode assembly member that can result from wiping with an acidic solution.

Figure 2:
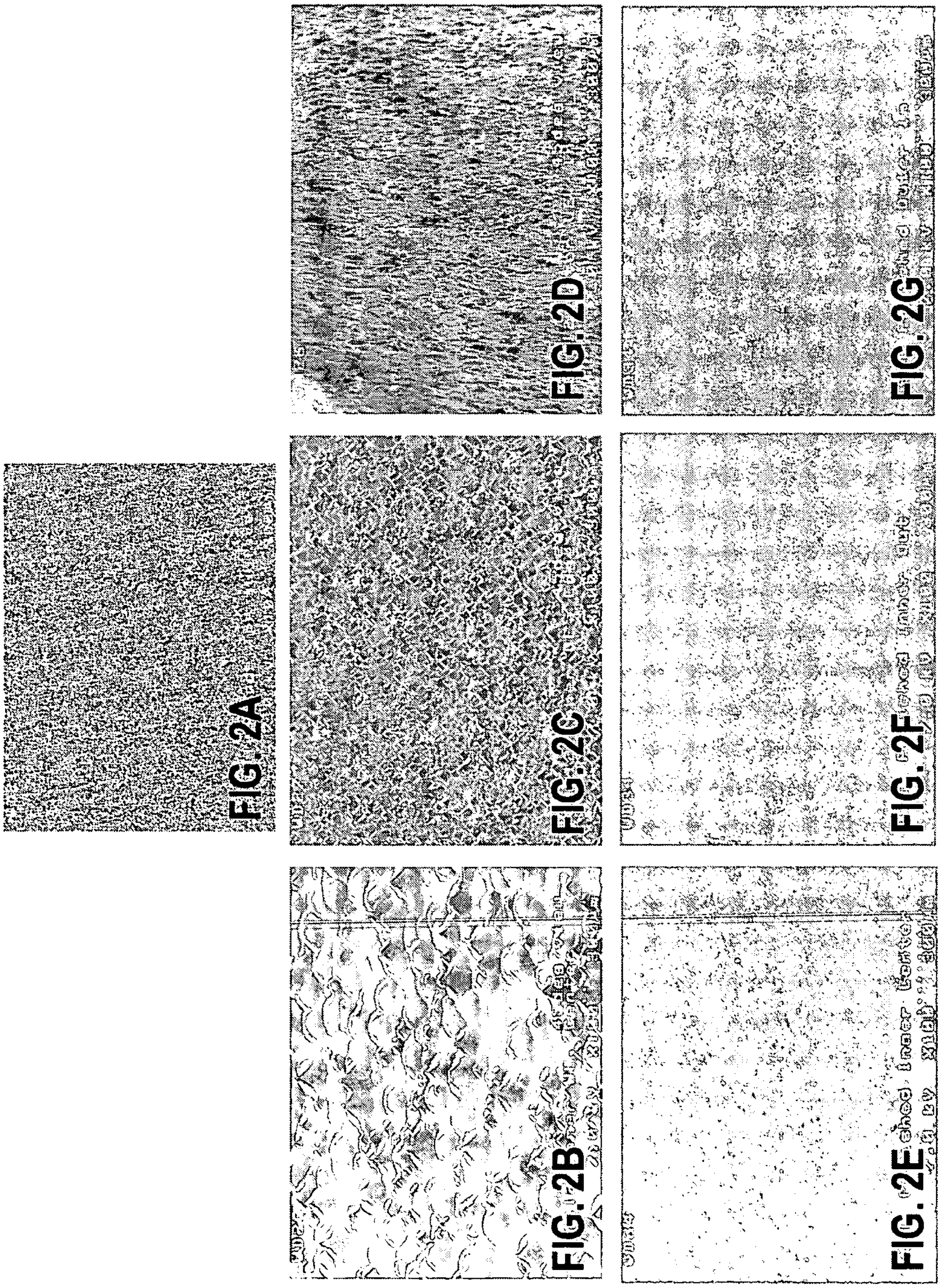
FIG. 2A shows silicon surface morphology of a new electrode assembly.
FIGS. 2B-D show silicon surface morphology of a used electrode assembly before polishing.
FIGS. 2E-G show silicon surface morphology of a used electrode assembly after polishing.

FIGS. 7A-D shows exemplary electrode assemblies before and after recovery.

DETAILED DESCRIPTION

Used silicon electrode assemblies exhibit etch rate drop and etch uniformity drift after a large number of RF hours (time in hours during which radio frequency power is used to generate the plasma) are run using the electrode assemblies. The decline of etch performance results from changes in the morphology of the silicon surface of the electrode assemblies as well as contamination of the silicon surface of the electrode assemblies, both of which are a product of the dielectric etch process.

Silicon surfaces of used electrode assemblies can be polished to remove black silicon and other metal contamination therefrom. Metallic contaminants can be efficiently removed from silicon surfaces of such electrode assemblies without discoloring the silicon surfaces by wiping with an acidic solution, which reduces the risk of damage to electrode assembly bonding materials. Accordingly, process window etch rate and etch uniformity can be restored to acceptable levels by cleaning the electrode assemblies.

Dielectric etch systems (e.g., Lam 2300 Exelan® and Lam Exelan® HPT) may contain silicon showerhead electrode assemblies containing gas outlets. As disclosed in commonly owned U.S. Pat. No. 6,376,385, which is incorporated herein by reference, an electrode assembly for a plasma reaction chamber wherein processing of a semiconductor substrate such as a single wafer can be carried out may include a support member such as a graphite backing ring or member, an electrode such as a silicon showerhead electrode in the form of a circular disk of uniform thickness and an elastomeric joint between the support member and the electrode.

The elastomeric joint allows movement between the support member and the electrode to compensate for thermal expansion as a result of temperature cycling of the electrode assembly. The elastomeric joint can include an electrically and/or thermally conductive filler and the elastomer can be a catalyst-cured polymer which is stable at high temperatures. For example, the elastomer bonding material may comprise silicon polymer and aluminum alloy powder filler. In order to avoid contacting the acidic solution with the bonding material of the electrode assembly, which may damage the bonding material, the silicon surface of the used electrode assembly is preferably wiped with the acidic solution.

Additionally, an electrode assembly may comprise an outer electrode ring or member surrounding an inner electrode and optionally separated therefrom by a ring of dielectric material. The outer electrode member is useful for extending the electrode to process larger wafers, such as 300 mm wafers. The silicon surface of the outer electrode member may comprise a flat surface and a beveled outer edge. Similar to the inner electrode, the outer electrode member is preferably provided with a backing member, e.g., the outer ring may comprise an electrically grounded ring to which the outer electrode member may be elastomer bonded. The backing member of the inner electrode and/or outer electrode member may have mounting holes for mounting in a capacitively coupled plasma processing tool. Both the inner electrode and outer electrode member are preferably comprised of single crystalline silicon, in order to minimize electrode assembly contaminants. The outer electrode member may be comprised of a number of segments (e.g., six segments) of single crystalline silicon, arranged in an annular configuration, each of the segments being bonded (e.g., elastomer bonded) to a backing member. Further, adjacent segments in the annular configuration may be overlapping, with gaps or joints between the adjacent segments.

Silicon electrode assemblies used in dielectric etch tools deteriorate after a large number of RF hours are run using the electrode assemblies, in part due to the formation of black silicon. "Black silicon" can form on a plasma-exposed silicon surface as a result of the surface being micro-masked by contaminants deposited on the surface during plasma processing operations. Specific plasma processing conditions affected by the formation of black silicon include high nitrogen and low oxygen and $C_xF_y$ concentrations at moderate RF power, as used during etching of low K vias. The micro-masked surface regions can be on the scale of from about 10 nm to about 10 microns. While not wishing to be bound to any particular theory, black silicon formation on the plasma-exposed surface of a silicon electrode (or other silicon part) is believed to occur as a result of non-contiguous polymer deposition on the silicon electrode during plasma processing operations.

A non-contiguous polymer deposit can form on the plasma-exposed surface, e.g., the bottom surface of a silicon upper electrode, during a main etching step for etching a dielectric material on a semiconductor substrate, such as silicon oxide or a low-k dielectric material layer. The polymer deposits typically form three-dimensional, island-like formations that selectively protect the underlying surface from etching. Once needle-like formations are formed, polymer deposits then form preferentially on the needle tips, thereby accelerating the micro-masking mechanism and black silicon propagation during the main etching step for successive substrates. The non-uniform, anisotropic etching of the micro-masked surface region(s) results in the formation of closely-spaced, needle-like or rod-like features on the surface. These features can prevent light from reflecting from the modified regions of the silicon surface, which causes those regions to have a black appearance. The needle-like micro features are closely spaced and can typically have a length of from about 10 nm (0.01 μm) to about 50,000 nm (50 μm) (and in some instances can have a length as high as about 1 mm or even greater), and can typically have a width of from about 10 nm to about 50 μm.

Silicon surfaces of electrode assemblies affected by black silicon may be recovered by polishing. Prior to polishing, the electrode assembly may be pre-cleaned to remove foreign materials. Such pre-cleaning may include $CO_2$ snow blasting, which involves directing a stream of small flakes of dry ice (e.g., generated by expanding liquid $CO_2$ to atmospheric pressure through a nozzle, thereby forming soft flakes of $CO_2$) at the surface being treated, so that the flakes hit small particulate contaminants less than one micron in size on the substrate, then vaporize via sublimation, lifting the contaminants from the surface. The contaminants and the $CO_2$ gas then typically are passed through a filter, such as a high efficiency particulate air (HEPA) filter, where the contaminants are collected and the gas is released. An example of a suitable snow-generating apparatus is Snow Gun-II™, commercially available from Vatran Systems, Inc. (Chula Vista, Calif.). Prior to polishing, the electrode assembly may be cleaned with acetone and/or isopropyl alcohol. For example, the electrode assembly may be immersed in acetone for 30 minutes and wiped to remove organic stains or deposits.

Polishing comprises grinding a surface of the electrode assembly on a lathe using a grinding wheel with appropriate roughness grade number and polishing the electrode assembly surface to a desired finish (e.g., 8μ-inches) using another wheel. Preferably, the silicon surface is polished under constant running water, in order to remove dirt and keep the electrode assembly wet. When water is added, a slurry may be generated during the polishing, which is to be cleaned from the electrode assembly surface. The electrode assembly may be polished first using an ErgoSCRUB™ and ScrubDISK. The polishing procedure (i.e., the selection and sequence of the polishing paper used), depends on the degree of damage of the silicon surface of the electrode assembly.

If severe pitting or damage is observed on the silicon electrode assembly, polishing can begin with, for example, a 140 or 160 grit diamond polishing disk until a uniform flat surface is achieved. Subsequent polishing can be with, for example, 220, 280, 360, 800, and/or 1350 grit diamond polishing disks. If minor pitting or damage is observed on the silicon electrode assembly, polishing can begin with, for example, a 280 grit diamond polishing disk until a uniform flat surface is achieved. Subsequent polishing can be with, for example, 360, 800, and/or 1350 grit diamond polishing disks.

During polishing, the electrode assembly is attached to a turntable, with a rotation speed of preferably about 40-160 rpm. A uniform, but not strong, force is preferably applied during polishing, as a strong force may cause damage to the silicon surface or bonding area of the electrode assembly. Accordingly, the polishing process may take a significant amount of time, depending on the degree of pitting or damage on the electrode assembly. The shape and angle of an outer electrode ring or member (e.g., the interface between the flat surface and the beveled outer edge) is preferably maintained during polishing. In order to minimize particles trapped inside gas outlets and within joints of electrode assemblies, a deionized water gun may be used to remove particles generated during polishing from the gas outlets and joints whenever changing polishing disks and UltraSOLV® ScrubPADs may be used to remove particles from the polishing disks.

Following polishing, the electrode assembly is preferably rinsed with deionized water and blown dry. The surface roughness of the electrode assembly may be measured using, for example, a Surfscan system. The surface roughness of the electrode assembly is preferably approximately 8μ-inches or less.

The electrode assembly is preferably immersed in deionized water at 80° C. for 1 hour in order to loosen particles that may be trapped in gas outlets and joints in the electrode assembly. The electrode assembly may be ultrasonically cleaned for 30 minutes in deionized water at about 60° C., to remove particles from the surface of the electrode assembly. The electrode assembly may be moved up and down within the ultrasonic bath during the ultrasonic cleaning in order to help remove trapped particles.

The electrode assembly, including gas outlets and joints or mounting holes of the electrode assembly, may be cleaned using a nitrogen/deionized water gun at a pressure of less than or equal to 50 psi. Special handling may be needed to avoid damaging or impacting a graphite backing member of the electrode assembly, as the graphite surface of a used electrode assembly might have a loose surface structure. Cleanroom paper, nylon wire, or white thread may be used to check particle removal quality, for example, from gas outlets and joints of the electrode assembly. The electrode assembly may be dried using a nitrogen gun at a pressure less than or equal to 50 psi.

Metallic contaminants, such as, for example, Al, Ca, Cr, Cu, Fe, K, Li, Mg, Mo, Na, Ni, and Ti, may be removed from the silicon surface of an electrode assembly, preferably a polished electrode assembly, without discoloring the silicon surface by cleaning the silicon surface with an acidic solution comprising hydrofluoric acid, nitric acid, acetic acid, and deionized water. The cleaning with an acidic solution comprising hydrofluoric acid, nitric acid, acetic acid, and deionized water preferably does not cause silicon surface morphology damage, such as pitting or surface roughness, or silicon surface color change, which reflects surface non-cleanliness as well as oxidation state changes.

With regards to the hydrofluoric acid and nitric acid components of the acidic solution, the chemical reaction of a solution of hydrofluoric acid and nitric acid with the silicon surface of an electrode assembly is as follows:

$$3Si+12HF+4HNO_3 \rightarrow 3SiF_4+4NO+8H_2O$$

$$[H^+][F^-]=k_1[HF]\ k_1=1.3\times10^{-3}\ mol/L$$

$$[HF][F^-]=k_2[HF_2]\ k_2=0.104\ mol/L$$

The dissolution rate of hydrofluoric acid is low, due to its low reaction constant, $k_1$, of $1.3\times10^{-3}$ mol/L. After treatment with a solution containing hydrofluoric acid, infrared spectroscopy analysis may reveal that a silicon surface of a silicon electrode is covered by Si—H (mono-hydrogen), Si—$H_2$ (di-hydrogen), and Si—$H_3$ (tri-hydrogen).

While not wishing to be bound by theory, it is believed that in the etching of silicon by an acidic solution of hydrofluoric acid and nitric acid, an electrochemical reaction takes place in which silicon is oxidized by nitric acid, followed by dissolution of the oxidized silicon by hydrofluoric acid. In an acidic solution with a low concentration of hydrofluoric acid, the activation energy of the etching process is 4 kcal/mol, at temperatures of 0 to 50° C. This single, low value is characteristic of a diffusion-controlled process, illustrated by the fact that the etch rates of different silicon materials are essentially the same at low concentrations. In contrast, in an acidic solution with a high concentration of hydrofluoric acid, two different activation energies are observed. At high temperatures the activation energy is 10-14 kcal/mol and at low temperatures the activation energy is approximately 20 kcal/mol. These values are characteristic of a surface-controlled process, in which dopant concentration of the silicon, crystal orientation of the silicon, and defects of the silicon play a role in the etching process.

Accordingly, the acidic solution preferably contains a low concentration of hydrofluoric acid, in order to avoid etch rate dependency on dopant concentration, crystal orientation, during the cleaning of the silicon surface of the electrode assembly. The acidic solution preferably etches silicon isotropically (non-directionally, i.e., the etch rate being relatively constant in all directions), as opposed to etching silicon anisotropically (unidirectionallly). While hydrofluoric acid can remove some metal impurities by forming complex ions with the metal impurities, hydrofluoric acid is not effective to remove, for example, Cu. However, nitric acid, a strong oxidizer, can react with impurities such as, for example, Al, Ca, Cr, Cu, Fe, K, Li, Mg, Mo, Na, Ni, Ti, Zn, and combinations thereof, to form ions, which can readily be removed. Nitric acid is preferably present in an amount that does not cause color change of the cleaned silicon surface.

Accordingly, an acidic solution of hydrofluoric acid and nitric acid can achieve high decontamination efficiency of silicon electrodes to meet dielectric etching process requirements for small etch feature sizes of 0.1 microns and less. However, as nitric acid is a strong oxidizer, when a contaminated silicon surface is exposed to a solution of hydrofluoric acid and nitric acid, nitric acid both oxidizes metal contaminants and reacts with the silicon, thereby causing silicon surface color change, including green, blue, brown, and purple. Experiments indicated that even for polished silicon electrode assemblies rinsed with deionized water, wiping the silicon surface with a solution of hydrofluoric acid and nitric acid caused the silicon surface color to change from a bright, uniform color to greenish, bluish, brownish, or purplish, depending on the metal contaminants present on the silicon surface.

In order to control the oxidation rate and provide a buffer solution to maintain a constant pH value, acetic acid is added to avoid silicon surface color change while maintaining high decontamination efficiency and surface cleanliness. However, as a high concentration of acetic acid may slow the silicon surface reaction and reduce cleaning efficiency, the silicon surface may exhibit color change. Further, the acetic acid may form complex ions with contaminants, e.g., metal ions. Accordingly, the acidic solution may comprise hydrofluoric acid in an amount of 0.25 to 1% by volume, nitric acid in an amount of 10 to 40% by volume, and acetic acid in an amount of 10 to 20% by volume.

To reduce the risk that the bonding material of the electrode assembly is chemically attacked by the acidic solution, metal contaminants are removed by contacting the silicon surface of the electrode assembly with the acidic solution, preferably by wiping, as opposed to soaking the electrode assembly in the acidic solution. Accidental contact of the acidic solution with the backing member or bonding area is thus avoided by contacting only the silicon surface of the electrode assembly with the acidic solution and by means of a fixture that allows the silicon surface of the electrode assembly to be supported facing downward while the silicon surface is cleaned. With the silicon surface of the electrode assembly supported facing downward, excess acidic solution applied to the silicon surface can be collected after dripping off of the silicon surface, as opposed to flowing to the backing member or bonding area. The backing member and bonding area are preferably immediately cleaned with deionized water if contacted with the acidic solution. Additionally, exposed electrode assembly bonding material is preferably protected by covering with masking material and/or chemical resistant tape prior to cleaning with the acidic solution.

Additional measures to avoid accidental contact of the acidic solution with the backing member or bonding area include drying the electrode assembly after wiping using compressed nitrogen gas, blown from the backing member down to the silicon surface, and blowing any residual solution from the silicon surface. After wiping, the solution is removed from the electrode assembly by rinsing the electrode assembly with deionized water. Similarly, potential attack of the bonding material by residual acidic solution during rinsing with deionized water may be further reduced by rinsing the backing member with deionized water followed by rinsing the silicon surface with deionized water. With the electrode assembly supported in a fixture with the silicon surface facing downward, the electrode assembly will be rinsed from the backing member down to the silicon surface, and through gas holes, if present.

The fixture, sized to the electrode assembly to be cleaned, has a sturdy base and three or more supporting members that raise the electrode assembly above the working bench surface, allowing the surface of the electrode assembly facing downward to be cleaned. As illustrated in FIG. 1A, showing a fixture for supporting an electrode assembly during cleaning, and FIG. 1B, showing an enlarged area of FIG. 1A, the top of each supporting member preferably has a step on which the electrode assembly rests and which prevents the electrode assembly from slipping off the supporting members. The supporting members, and base, are preferably coated with and/or made from a chemically resistant material, such as Teflon® (polytetrafluoroethylene), which is chemically resistant to acids.

The metallic contaminant cleaning procedure may comprise pre-cleaning by wiping the electrode assembly with acetone and/or isopropyl alcohol and rinsing with deionized water followed by wiping the silicon surface of an electrode assembly with the acidic solution, rinsing the electrode assembly with deionized water and blowing dry with nitrogen, again wiping the silicon surface with the acidic solution, rinsing the electrode assembly with deionized water, ultrasonically cleaning the electrode assembly in deionized water for 60 minutes, rinsing the electrode assembly with deionized water and blowing dry with nitrogen, and baking the electrode assembly for 2 hours at 120° C.

The electrode assembly is preferably inspected prior to recovery and after recovery to ensure that the recovered electrode assembly conforms to product specifications. Inspection may include measuring, for example, dimensions (e.g., thickness), surface roughness (Ra, e.g., 16μ-inches or less, preferably 8μ-inches or less), surface cleanliness (Inductively Coupled Plasma Mass Spectrometry analysis), surface particle count as measured by, for example, a QIII®+Surface Particle Detector (Pentagon Technologies, Livermore, Calif.), surface morphology (e.g., by scanning electron microscopy (SEM)), and measurement of black silicon pits and etch depths. Further, plasma etch chamber performance of the recovered electrode assemblies are preferably tested to ensure that the recovered electrode assembly exhibits acceptable etch rate and etch uniformity.

FIG. 2A (Ra=16μ-inches) shows silicon surface morphology of a new electrode assembly, FIGS. 2B-D (Ra=240, 170, and 290μ-inches, respectively) show silicon surface morphology of a used electrode assembly before polishing, and FIGS. 2E-G (Ra=9, 9, and 10μ-inches, respectively) show silicon surface morphology of a used electrode assembly after polishing. FIGS. 2A-G show SEM images of a silicon surface at a magnification of 100 times. The electrode assembly of FIG. 2 has an inner electrode and an outer electrode member, as discussed above. FIGS. 2B and 2E are images taken from the center of the inner electrode, FIGS. 2C and 2F are images taken from the edge of the inner electrode, and FIGS. 2D and 2G are images taken from the outer electrode member. FIG. 2 shows that polishing recovers the silicon surface morphology and roughness of a used electrode assembly to the state of a new electrode assembly.

Figure 3:
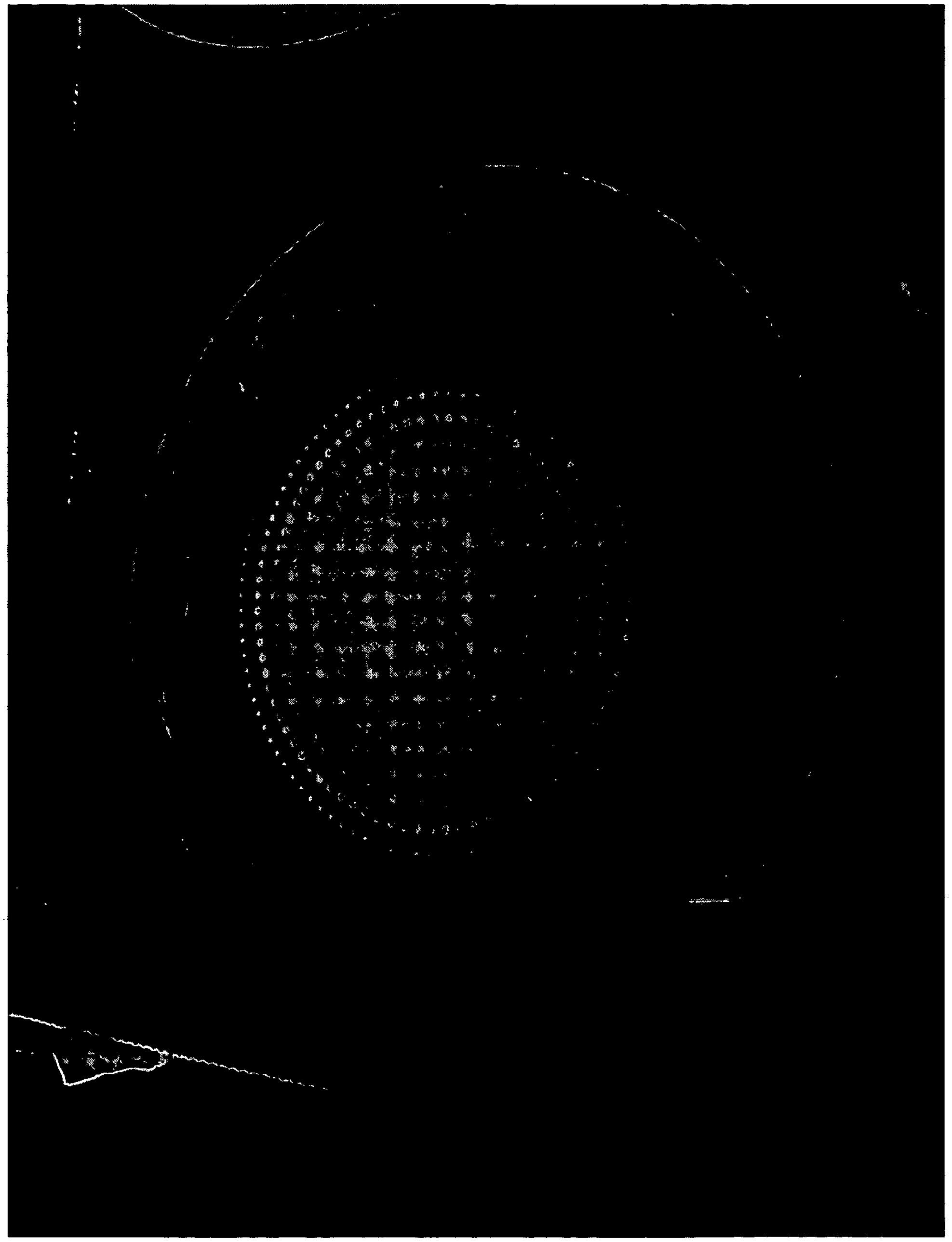
FIGS. 3 and 4 show exemplary used electrode assemblies that have not been cleaned.
Figure 4:
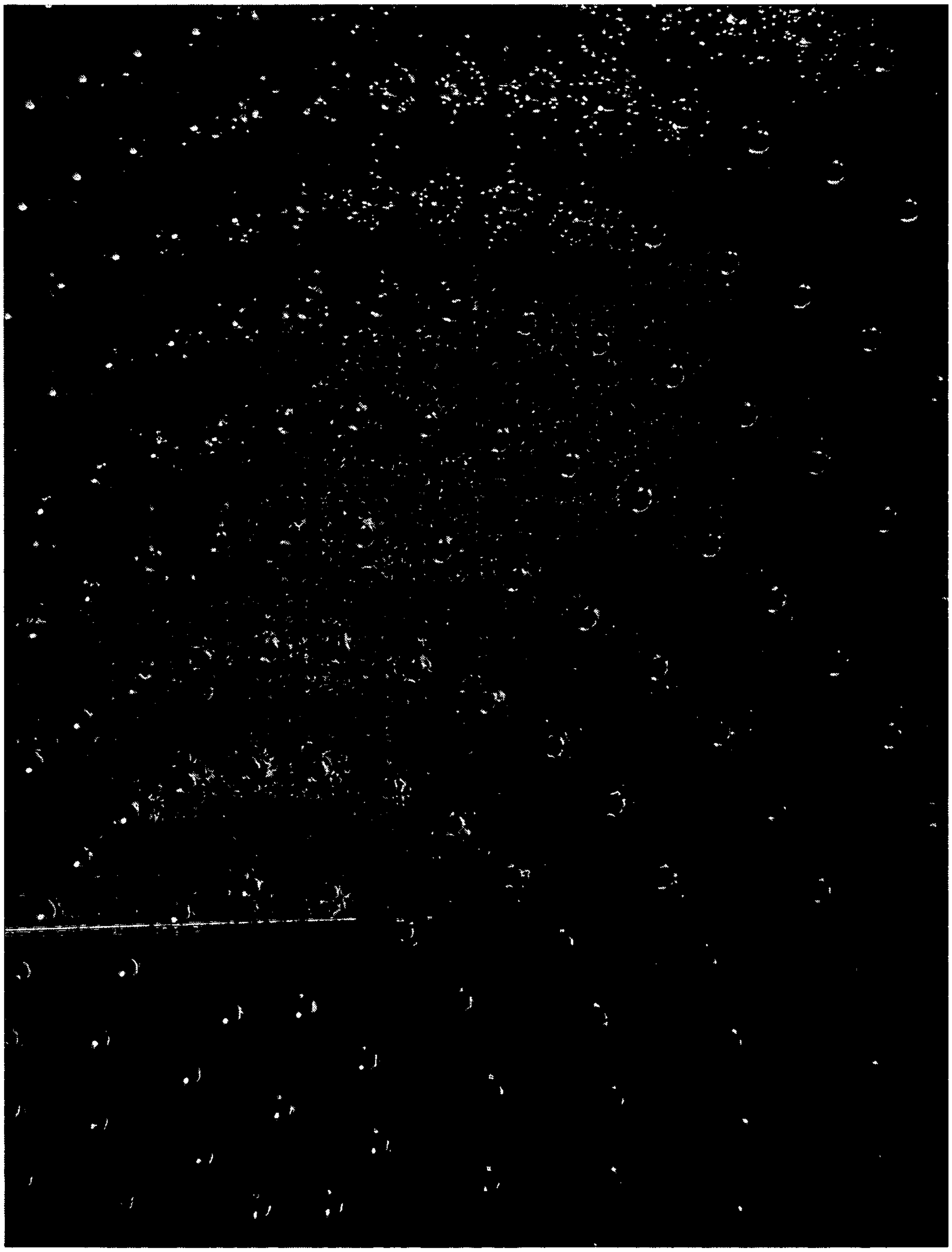
Figure 5:
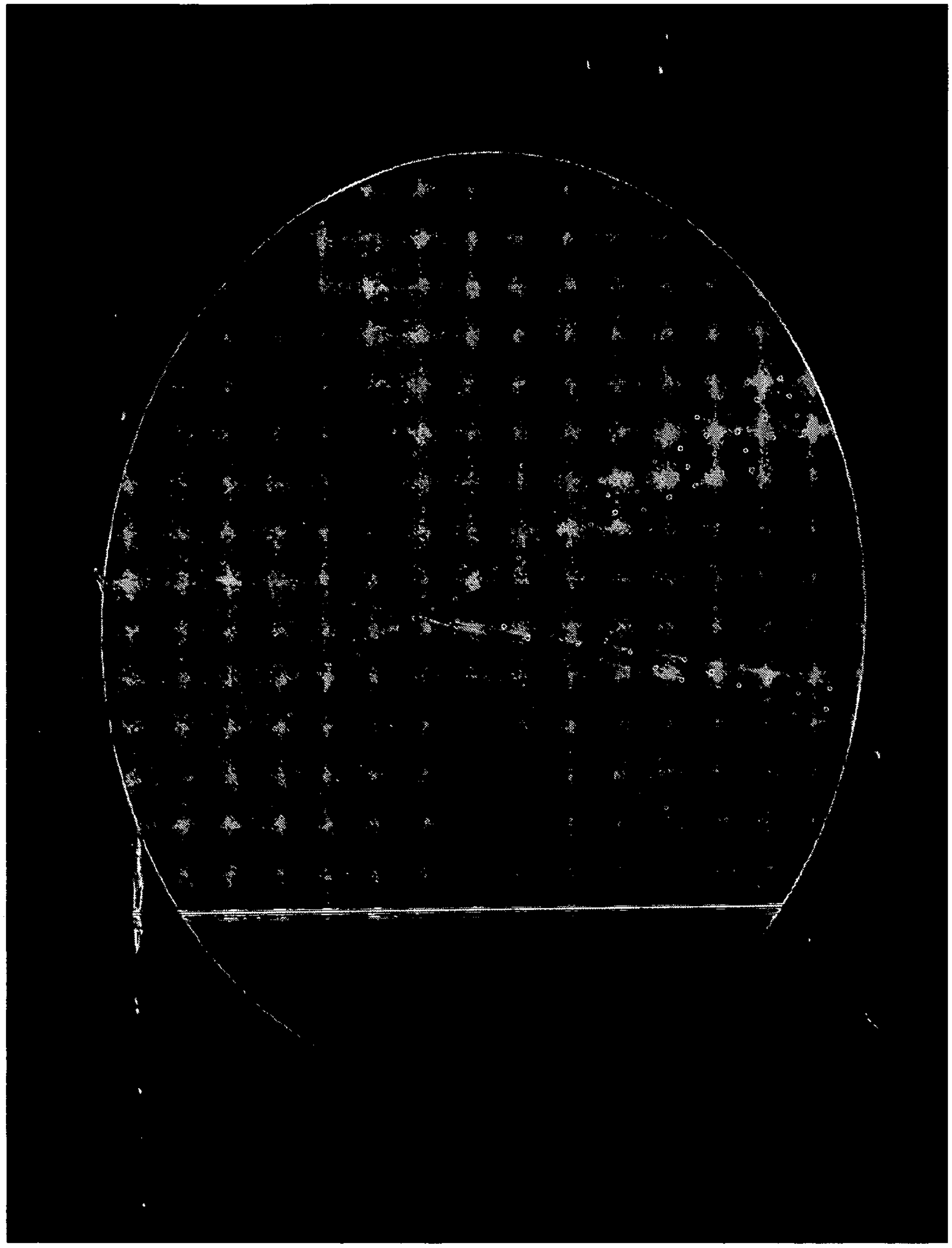
FIG. 5 shows an exemplary recovered electrode assembly.

FIGS. 3 and 4 show exemplary used electrode assemblies that have not been cleaned and FIG. 5 shows an exemplary recovered electrode assembly. FIG. 6A shows discoloration of the silicon surface of an inner electrode assembly that can result from wiping with an acidic solution and FIG. 6B shows discoloration of the silicon surface of an outer electrode assembly member that can result from wiping with an acidic solution. FIGS. 7A (Ra>150μ-inches) and 7B (Ra>300μ-inches) shows exemplary used electrode assemblies before recovery, while FIGS. 7C and 7D (both having Ra<8μ-inches) show exemplary electrode assemblies after recovery. FIGS. 7A and 7C show outer electrode members, while FIGS. 7B and 7D show inner electrodes.

EXAMPLES

The following methods for cleaning silicon electrode assembly surfaces are provided to be illustrative, but not limiting.

In the acidic solutions tested, the hydrofluoric acid was added to the solution as an aqueous solution having a concentration of 49% hydrofluoric acid, the nitric acid was added to the solution as an aqueous solution having a concentration of 70% nitric acid, and the acetic acid was added in a non-diluted form, i.e., a concentration of 100% acetic acid.

Example 1

Cleaning an electrode assembly by polishing and wiping the silicon electrode surface with a solution of 1% hydrofluoric acid, 30% nitric acid, and 15% acetic acid did not cause silicon surface color change, pitting or damage. The solution had a silicon etch rate of 65 Å/second.

Example 2

Cleaning an electrode assembly by polishing and wiping the silicon electrode surface with a solution of 1% hydrofluoric acid, 40% nitric acid, and 15% acetic acid did not cause silicon surface color change, pitting or damage. The solution had a silicon etch rate of 70 Å/second.

Example 3

Table I provides Inductively Coupled Plasma Mass Spectrometry elemental surface concentrations ($\times 10^{10}$ atoms/$cm^2$) for a 100 $cm^2$ area average on samples taken from five different silicon electrode assemblies previously used for plasma etching dielectric materials. Samples 1-3 were taken from electrodes cleaned by polishing and wiping the silicon electrode surface with a solution of 1% hydrofluoric acid, 40% nitric acid, and 15% acetic acid and samples 4 and 5 were taken from electrodes cleaned by polishing and wiping the silicon electrode surface with a solution of 1% hydrofluoric acid, 30% nitric acid, and 15% acetic acid or a solution of 1% hydrofluoric acid, 40% nitric acid, and 15% acetic acid.

TABLE I

| Element | Sample 1 | Sample 2 | Sample 3 | Sample 4 | Sample 5 |
|---|---|---|---|---|---|
| Aluminum (Al) | 68 | 85 | 78 | 41 | 30 |
| Antimony (Sb) | 0.45 | 0.87 | 1.8 | 2.3 | 1.7 |
| Arsenic (As) | <1 | <1 | <1 | <1 | <1 |
| Barium (Ba) | 0.65 | 0.50 | 0.90 | <0.3 | <0.3 |
| Beryllium (Be) | <5 | <5 | <5 | <5 | <5 |
| Bismuth (Bi) | <0.1 | <0.1 | <0.1 | <0.1 | <0.1 |
| Boron (B) | 1,600 | 210 | 280 | 200 | 150 |
| Cadmium (Cd) | 0.23 | <0.2 | <0.2 | <0.2 | <0.2 |
| Calcium (Ca) | 190 | 160 | 120 | 53 | 39 |
| Chromium (Cr) | <5 | <5 | <5 | <5 | <5 |
| Cobalt (Co) | <1 | <1 | <1 | <1 | <1 |
| Copper (Cu) | 300 | 3.8 | <2 | 220 | 170 |
| Gallium (Ga) | <0.2 | <0.2 | <0.2 | <0.2 | <0.2 |
| Germanium (Ge) | <0.3 | <0.3 | <0.3 | <0.3 | <0.3 |
| Iron (Fe) | 50 | 42 | 23 | <5 | <5 |
| Lead (Pb) | <0.1 | <0.1 | 0.18 | <0.1 | <0.1 |
| Lithium (Li) | <3 | <3 | <3 | <3 | <3 |
| Magnesium (Mg) | 55 | 54 | 27 | 26 | 19 |
| Manganese (Mn) | <1 | <1 | <1 | <1 | <1 |
| Molybdenum (Mo) | <0.3 | <0.3 | <0.3 | <0.3 | <0.3 |
| Nickel (Ni) | 3.9 | 17 | 13 | <2 | <2 |
| Potassium (K) | <10 | <10 | 18 | <10 | <10 |
| Sodium (Na) | 110 | 110 | 220 | 150 | 110 |
| Strontium (Sr) | 0.82 | 0.53 | 0.98 | <0.3 | <0.3 |
| Tin (Sn) | <1 | <1 | <1 | <1 | <1 |
| Titanium (Ti) | 18 | 11 | 17 | 14 | 10 |
| Tungsten (W) | <0.5 | <0.5 | <0.5 | <0.5 | <0.5 |
| Vanadium (V) | <1 | 1.3 | <1 | <1 | <1 |
| Zinc (Zn) | 140 | 85 | 77 | 19 | 14 |
| Zirconium (Zr) | 0.22 | 0.17 | <0.1 | <0.1 | <0.1 |

While various embodiments have been described, it is to be understood that variations and modifications may be resorted to as will be apparent to those skilled in the art. Such variations and modifications are to be considered within the purview and scope of the claims appended hereto.

The invention claimed is:

1. A method of cleaning a used electrode assembly for generating plasma in a plasma etch chamber comprising a plasma-exposed silicon surface, the method comprising contacting the silicon surface with an acidic cleaning solution comprising:

0.25 to 1% by volume hydrofluoric acid;
10 to 40% by volume nitric acid;
10 to 20% by volume acetic acid; and
balance deionized water; and
wherein contaminants are removed from the silicon surface; and
further wherein the silicon surface is not discolored as the acetic acid is present in an amount effective to control oxidation by the nitric acid.

2. The method of claim 1, wherein the acidic solution etches the silicon surface.

3. The method of claim 2, wherein the hydrofluoric acid is present in an amount such that the silicon surface is etched in a diffusion-controlled process.

4. The method of claim 1, wherein the hydrofluoric acid and nitric acid are present in an amount effective to remove contaminants from the silicon surface.

5. The method of claim 1, wherein the nitric acid removes contaminants selected from the group consisting of Al, Ca, Cr, Cu, Fe, K, Li, Mg, Mo, Na, Ni, Ti, Zn, and combinations thereof from the silicon surface.

6. The method of claim 1, wherein the nitric acid is present in an amount effective to oxidize contaminants selected from the group consisting of Al, Ca, Cr, Cu, Fe, K, Li, Mg, Mo, Na, Ni, Ti, Zn, and combinations thereof.

7. The method of claim 1, wherein the nitric acid is present in an amount effective to form ions with contaminants selected from the group consisting of Al, Ca, Cr, Cu, Fe, K, Li, Mg, Mo, Na, Ni, Ti, Zn, and combinations thereof.

8. The method of claim 1, wherein the nitric acid is present in an amount that does not cause silicon surface discoloration.

9. The method of claim 1, wherein the nitric acid oxidizes silicon to form oxidized silicon.

10. The method of claim 9, wherein the hydrofluoric acid dissolves the oxidized silicon.

11. The method of claim 1, wherein the acetic acid is present in an amount effective to avoid silicon surface discoloration.

12. The method of claim 1, wherein the acetic acid forms complex ions with contaminants.

13. The method of claim 1, wherein the contacting comprises wiping the silicon surface with the acidic solution.

14. The method of claim 1, wherein the silicon surface is single crystalline silicon.

15. An electrode assembly cleaned according to the method of claim 1.

16. A method of etching a dielectric material in a plasma etching chamber using the cleaned electrode assembly of claim 1.

17. A method of cleaning a used electrode assembly comprising a plasma-exposed silicon surface, the method comprising contacting the silicon surface with an acidic cleaning solution comprising:

0.25 to 1% by volume hydrofluoric acid;
10 to 40% by volume nitric acid;
10 to 20% by volume acetic acid; and
balance deionized water; and
wherein black silicon contaminants are removed from the silicon surface;
wherein the silicon surface is not discolored as the acetic acid is present in an amount effective to control oxidation by the nitric acid; and
wherein the electrode assembly is a showerhead electrode having gas outlets.

18. A method of cleaning a used electrode assembly comprising a plasma-exposed silicon surface, the method comprising contacting the silicon surface with an acidic cleaning solution comprising:

0.25 to 1% by volume hydrofluoric acid;
10 to 40% by volume nitric acid;
10 to 20% by volume acetic acid; and
balance deionized water; and
wherein contaminants are removed from the silicon surface;
wherein the silicon surface is not discolored as the acetic acid is present in an amount effective to control oxidation by the nitric acid; and
wherein the silicon surface is elastomer bonded to a graphite backing member.

19. The method of claim 18, wherein the graphite backing member contains mounting holes.

20. A method of cleaning a used electrode assembly comprising a plasma-exposed silicon surface, the method comprising contacting the silicon surface with an acidic cleaning solution comprising:

0.25 to 1% by volume hydrofluoric acid;
10 to 40% by volume nitric acid;
10 to 20% by volume acetic acid; and
balance deionized water; and
wherein contaminants are removed from the silicon surface;
wherein the silicon surface is not discolored as the acetic acid is present in an amount effective to control oxidation by the nitric acid; and
wherein the electrode assembly comprises an inner showerhead electrode surrounded by an outer electrode member.

21. The method of claim 20, wherein the outer electrode member is comprised of silicon segments arranged in an annular configuration.

* * * * *